United States Patent
Stoeger et al.

(10) Patent No.: US 9,033,528 B2
(45) Date of Patent: May 19, 2015

(54) DEVICE FOR CONCENTRATING SOLAR RADIATION IN AN ABSORBER

(75) Inventors: Elmar Stoeger, Bad Erlach (AT); Gerald Munzenrieder, Apetlon (AT)

(73) Assignee: Heliovis AG, Wiener Neudorf (AT)

( * ) Notice: Subject to any disclaimer, the term of this patent is extended or adjusted under 35 U.S.C. 154(b) by 0 days.

(21) Appl. No.: 14/114,295

(22) PCT Filed: Apr. 30, 2012

(86) PCT No.: PCT/AT2012/000119
§ 371 (c)(1),
(2), (4) Date: Nov. 15, 2013

(87) PCT Pub. No.: WO2012/145774
PCT Pub. Date: Nov. 1, 2012

(65) Prior Publication Data
US 2014/0071551 A1    Mar. 13, 2014

(30) Foreign Application Priority Data
Apr. 29, 2011   (AT) .................................. A 605/2011

(51) Int. Cl.
*G02B 19/00* (2006.01)
*F24J 2/05* (2006.01)
(Continued)

(52) U.S. Cl.
CPC .............. *G02B 19/0042* (2013.01); *F24J 2/055* (2013.01); *F24J 2/145* (2013.01); *F24J 2/36* (2013.01); *F24J 2/50* (2013.01); *F24J 2/541* (2013.01); *Y02E 10/44* (2013.01); *Y02E 10/52* (2013.01); *Y02E 10/45* (2013.01); *Y02E 10/47* (2013.01); *F24J 2/4636* (2013.01); *H02S 20/00* (2013.01); *H01L 31/0547* (2014.12)

(58) Field of Classification Search
CPC .... G02B 19/00; G02B 19/0042; G02B 7/188; F24J 2/24; F24J 2/10; F24J 2/36; F24J 2/38; F24J 2/14; F24J 2/46; B23P 15/26

USPC ......... 359/838, 839, 847, 848, 849, 850, 857; 126/600, 601, 624, 684, 651, 657, 693; 29/890.033
See application file for complete search history.

(56) References Cited

U.S. PATENT DOCUMENTS 3,976,508 A * 8/1976 Mlavsky ....................... 136/246
2004/0055594 A1  3/2004 Hochberg et al.
(Continued)

FOREIGN PATENT DOCUMENTS

AT    505 075 B1    10/2008
CH    699 605 A1    3/2010
(Continued)

OTHER PUBLICATIONS

International Search Report of PCT/AT2012/000119, mailed May 6, 2013.
(Continued)

*Primary Examiner* — Scott J Sugarman
*Assistant Examiner* — William R Alexander
(74) *Attorney, Agent, or Firm* — Collard & Roe, P.C.

(57) ABSTRACT

A device (1) for concentrating solar radiation in an absorber (2), an anchoring frame (8) and an inflatable concentrator pad (3), which has a light-transmissive entry window (4) for coupling in the solar radiation and a reflector film (5) subdividing the concentrator pad (3) into at least two cavities (6, 7), wherein the reflector film (5) is designed to concentrate the solar radiation in the absorber (2) which is arranged in the cavity (6) of the concentrator pad (3), and with an anchoring frame (8), arranged outside of the concentrator pad (3), for anchoring the concentrator pad (3), wherein the absorber (2) is attached to the anchoring frame (8) by means of an absorber mount (15) and the concentrator pad (3) has at least one attachment opening (26) for the absorber mount (15) to pass through.

14 Claims, 13 Drawing Sheets

(51) Int. Cl.
*F24J 2/14* (2006.01)
*F24J 2/36* (2006.01)
*F24J 2/50* (2006.01)
*F24J 2/54* (2006.01)
*F24J 2/46* (2006.01)
*H01L 31/042* (2014.01)
*H01L 31/054* (2014.01)

(56) References Cited

U.S. PATENT DOCUMENTS

2009/0056703 A1* 3/2009 Mills et al. .................. 126/692
2010/0186733 A1 7/2010 Hoefler
2010/0229850 A1* 9/2010 Sankrithi ..................... 126/601
2010/0269817 A1* 10/2010 Kelly .......................... 126/698
2011/0114083 A1* 5/2011 Pedretti ....................... 126/657
2012/0174911 A1 7/2012 Pedretti

FOREIGN PATENT DOCUMENTS

WO 2009/117840 * 10/2009 .................. 126/657
WO 2009/117840 A2 10/2009

OTHER PUBLICATIONS

Austrian Office Action of A 605/2011, dated Dec. 12, 2011, with English translation of relevant parts.

* cited by examiner

DEVICE FOR CONCENTRATING SOLAR RADIATION IN AN ABSORBER

CROSS REFERENCE TO RELATED APPLICATIONS

This application is the National Stage of PCT/AT2012/000119 filed on Apr. 30, 2012, which claims priority under 35 U.S.C. §119 of Austrian Application No. A 605/2011 filed on Apr. 29, 2011, the disclosure of which is incorporated by reference. The international application under PCT article 21(2) was not published in English.

The invention relates to a device for concentrating solar radiation in an absorber, with an inflatable concentrator pad, which has a light-transmissive entry window for coupling in the solar radiation and a reflector film subdividing the concentrator pad into at least two cavities, wherein the reflector film is designed to concentrate the solar radiation in the absorber which is arranged in the cavity of the concentrator pad, and with an anchoring frame arranged outside the concentrator pad for anchoring the concentrator pad.

The invention further relates to an anchoring frame for an inflatable concentrator pad for concentrating the solar radiation in an absorber arranged therein, with a frame provided for arrangement outside the concentrator pad which frame is designed for anchoring the concentrator pad.

Finally the invention relates to an inflatable concentrator pad for concentrating solar radiation with an absorber arrangeable therein, with a light-transmissive entry window for coupling in the solar radiation and a reflector film subdividing the concentrator pad into at least two cavities, wherein the reflector film is designed to concentrate the solar radiation in the absorber.

The WO 2009/117840 A2 has disclosed a parabolic trough collector with a support structure, which comprises a rectangular frame mounted in a swivel mechanism. The swivel mechanism makes it possible for the collector to follow the respective position of the sun. According to the embodiment shown in FIG. 5 a pressure cell with two pressure chambers is provided which are formed by a concentrator. The concentrator reflects the incident solar radiation onto a secondary concentrator which concentrates the pre-concentrated radiation against a secondary focal line area at the place of an absorber line which is arranged inside the pressure cell. To this end the absorber line is supported via a supporting framework against holding plates of the frame which are clamped into the frame arranged outside the collector.

The US 2010/0229850 A1 describes an inflatable solar collector with a reflector film which divides the collector into two pressure chambers. The collector is mounted in a frame, which comprises several rings encircling the collector, which rings are pivotably mounted for moving the collector. The absorber is arranged outside the collector.

The AT 505 075 B1 discloses an inflatable solar collector configured as a cylindrical hose. The hose which is transparent on its top is divided into two chambers by a reflector membrane. The reflector membrane provided with a reflective surface on its top extends essentially along the entire hose. To convert the solar energy an absorber arranged in longitudinal direction of the solar collector is provided in the chamber above the reflector membrane, which absorber may, for example, be implemented as a pipe carrying the medium; alternatively the absorber may be formed by photo voltaic elements. The solar radiation is reflected by the reflector membrane in direction of the absorber, causing a medium in the absorber to be heated. For terrestrial power generation the solar collector is arranged in a position favourable for the position of the sun and moved to track the path of the sun. For this purpose the solar collector is pivotably mounted about its longitudinal axis by means of support rollers. In addition anchoring straps are attached to the solar collector.

In the above embodiments the absorber was directly attached to the inflatable solar collector. As such the weight of the absorber (or a suspension device connected with it) was supported solely by the casing of the solar collector causing the casing to become deformed in the area of the attachment points of the absorber on the solar collector. This has an adverse effect on the focussing of the solar radiation on the reflector film in the absorber. When the concentrator pad filled with compressed air supports the absorber it may happen, depending on the operating position of the concentrator pad, that the absorber disadvantageously sags more than usual; in addition the weight of the absorber increases the sagging of the concentrator pad between its support points. The suspension of the absorber on the concentrator pad therefore has the disadvantageous effect that the sun rays reflected by the reflector film are not accurately bundled in the line of the absorber. Thus energy conversion losses were unavoidable. This problem occurs more frequently on larger solar collectors since the extent of the depression due to suspending the absorber from the casing increases as the diameter of the casing increases.

Therefore it is the object of the present invention to propose a device, an anchoring frame and a concentrator pad of the before mentioned type which is improved as regards the above mentioned problems. As such the absorber is to be arranged with high accuracy in the focal range of the reflector film, wherein deformation of the concentrator pad shall be reliably avoided.

This object is met by the device having the features described herein and with the absorber being attached to the anchoring frame by means of an absorber mount, wherein the concentrator pad comprises at least one attachment opening for the absorber mount to pass through. Preferred embodiments of the invention are also described herein.

Thus the absorber is suspended via the absorber mount on the anchoring frame provided outside the concentrator pad, so that the weight of the absorber and the absorber mount is born by the anchoring frame in an assembled operating position of the device. To this end the anchoring frame comprises a sufficient stiffness or stability, which is achieved, for example, by a metal structure. By connecting the absorber to the anchoring frame a deformation of the concentrator casing is reliably prevented so that the absorber can be very accurately positioned in the focal range of the reflector film. By this means the efficiency in energy conversion can be considerably increased. As long as a uniform suspension of the absorber on the anchoring frame is ensured, sagging of the absorber under its own weight can in addition be reduced, so that the absorber, across its entire length, lies in the focus of the reflector film. This will allow the energy yield to be further increased in operation. By utilising an already existing anchoring frame in addition to the mounting of the absorber, a constructionally simple part-saving implementation can be achieved, which is characterised by low erection costs.

With a preferred embodiment of the invention provision is made for the absorber mount to be connected to a tracking system of the anchoring frame, which is designed to pivotably mount the concentrator pad about at least one axis. The tracking system of the anchoring frame serves to cause the concentrator pad to track the sun's path in order to position the concentrator pad when in operation in a favourable position in relation to the sun. To this end it is favourable if the concentrator pad is pivotably mounted by means of the tracking system about a longitudinal axis of the concentrator pad.

For connecting the absorber mount to the tracking system of the anchoring frame it is favourable if the absorber mount is connected with at least one tracking ring surrounding the concentrator pad, preferably with several tracking rings spaced apart in longitudinal direction of the concentrator pad. In the operating position of the device the absorber is supported by the at least one tracking ring of the tracking system via the absorber mount, which ring at least partially encircles the concentrator pad. In order to achieve a uniform suspension of the absorber, preferably several tracking rings distributed along the length of the concentrator pad are provided, which are respectively connected with the absorber via the absorber mount. Each tracking ring may be composed of several individual rings, whereby an especially stable, weight-saving structure is achieved. In order to cause the concentrator pad to automatically track the sun's path it is of advantage if the tracking rings are rotatably (by means of drive) mounted about their central axis which preferably essentially coincides with the longitudinal axis of the concentrator pad.

In order to compensate for thermally caused changes in length of the absorber mount relative to the anchoring frame, it is of advantage if the absorber mount is movably mounted on the anchoring frame, in particular on the tracking ring, in longitudinal direction of the absorber. When the device is in operation, the absorber mount may be subjected to linear expansions other than the anchoring frame. One cause for this may be that the thermal linear expansions in the absorber mount or the anchoring frame may act in different directions. In addition local temperature differences may occur, which have influence on the extent of the changes in length in the area of the anchoring frame or the absorber mount. The deviations between the changes in length occurring during operation can then be taken care of by moving the absorber mount relative to the anchoring frame.

In order to movably mount the absorber mount on the anchoring frame it is favourable if a linear plain bearing is formed between the tracking system and the absorber mount, which comprises a slide fixed on the anchoring frame or the absorber mount and a corresponding guide rail fixed on the absorber mount or the tracking system. Depending upon the implementation the arrangement of slide and guide rail on the absorber mount or the anchoring frame can also be reversed. Alternatively other types of bearing such as a roller bearing may be provided.

To ensure a stable suspension of the absorber on the anchoring frame it is favourable if the absorber mount comprises a bearing unit arranged outside the concentrator pad and connected with the anchoring frame and an absorber holder arranged inside the concentrator pad, which is connected with the absorber.

To ensure a uniform, stable suspension of the absorber along the length of the absorber it is favourable if the bearing unit of the absorber mount comprises at least one pipe-shaped bearing element, in particular several pipe-shaped bearing elements, the end sections of which are plugged into each other. Pipe-shaped bearing elements are characterised by high stiffness and low weight. The stiffness of such a pipe-shaped bearing element moreover is direction-independent so that in any position of the concentrator pad which in particular is dependent upon the position of the sun, the deflection of the absorber mount is minimal.

Since the bearing unit of the absorber mount and the absorber holder may be subjected to temperature fluctuations when in operation and thus my experience fluctuations in heat expansion, it is favourable if the bearing unit arranged outside the concentrator pad and the holding unit of the absorber mount arranged inside the concentrator pad are movably mounted towards each other by means of a linear guide, in particular a linear plain bearing, in longitudinal direction of the absorber.

For connecting the bearing unit of the absorber mount arranged outside the concentrator pad with the absorber holder arranged inside the concentrator pad it is favourable if the bearing unit arranged outside the concentrator pad and the absorber holder of the absorber mount arranged inside the concentrator pad are connected with each other via an attachment opening of the concentrator pad sealed on all sides. The attachment opening of the concentrator pad is conveniently provided in the area of the entry window, which is preferably formed by a transparent (plastic) film. To this end it is favourable if the entry window comprises two film webs extending essentially in parallel, wherein the attachment opening is formed between the film webs; depending upon the implementation the absorber holder is connected with the bearing unit (and thus with the anchoring frame) at certain intervals or over the entire length of the absorber mount. In this way it is possible to ensure that the absorber is evenly supported along its longitudinal extension.

For sealing the attachment opening of the concentrator pad a keder system is preferably provided. According to a preferred embodiment sections of the concentrator pad adjacent to the attachment opening are folded over a keder and fixed by means of clamping plates of the absorber mount which are arranged inside and outside the concentrator pad. According to an alternative preferred embodiment the keder system comprises a profile element which extends along the attachment opening. The keders are arranged inside the profile element, which comprises lateral openings to allow edge areas of the concentrator pad adjacent to the attachment openings to pass through. When inflating the concentrator pad the keders are pressed against the lateral inside surfaces of the profile elements causing the attachment opening to be sealed against the outside. Thus sealing of the attachment opening is advantageously achieved without additional expense.

For sealing the attachment opening of the concentrator pad it is favourable if a clamping element, in particular a screw, acting between the clamping plates of the absorber mount is provided for applying a clamping force between the clamping plates. In addition it can be of advantage to provide adhesive strips in the folded-over sections of the concentrator pad for reliably retaining the keder system in the intended position.

In order to further reduce or completely prevent sagging of the absorber mount between adjacent tracking rings of the tracking facility, it is favourable if a supporting or tensioning system is arranged between the anchoring frame and the absorber mount, in particular in an area outside the connections with the anchoring frame. To this end it is of advantage in particular, if the supporting or tensioning system comprises at least one in particular rope-type tensioning element the ends of which are attached to the absorber mount or the anchoring frame, in particular to a supporting element connected with the tracking ring.

The object on which the invention is based is further met by an anchoring frame of the kind mentioned in the beginning, where the frame comprises an absorber mount which is designed to support the absorber in a state connected with the absorber.

Finally the object is met by an inflatable concentrator pad of the kind mentioned in the beginning, where the concentrator pad comprises at least one attachment opening for allowing an absorber mount connectable to the absorber to pass through. The achievable advantages or technical effects respectively correspond to the above-described device, whereby reference is hereby made to these explanations in order to avoid repetitions.

The invention will now be further explained by way of the embodiments shown in the figures to which it shall, however, not be restricted. In the drawing FIG. 1 shows an illustrative view of a device according to the invention for concentrating solar radiation in an absorber by means of a concentrator pad, wherein the absorber is attached via an absorber mount to an anchoring frame;

Figure 9A:
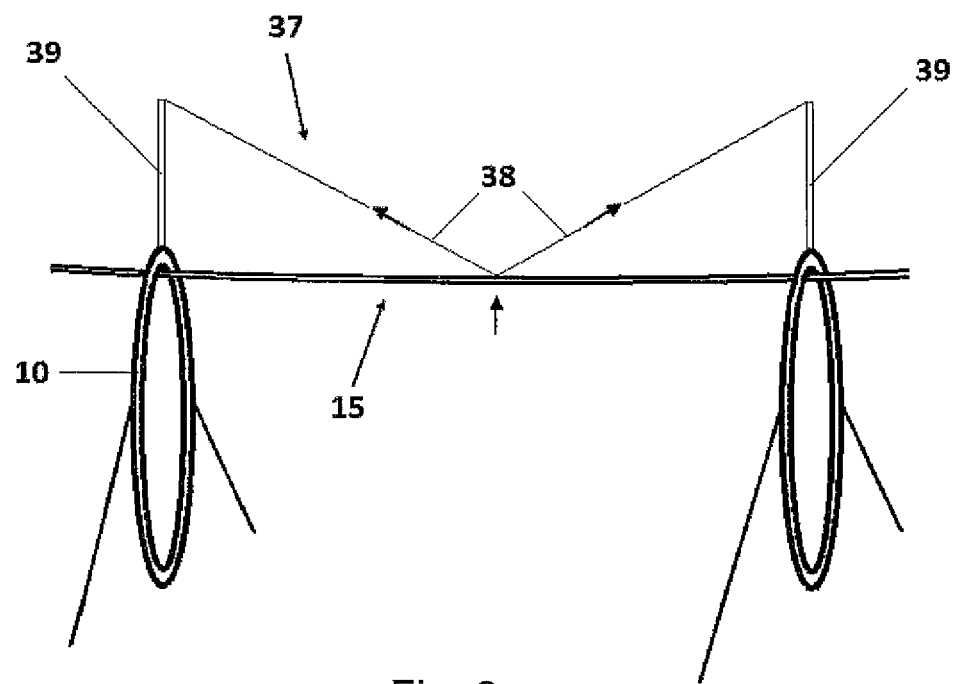
Figure 9B:
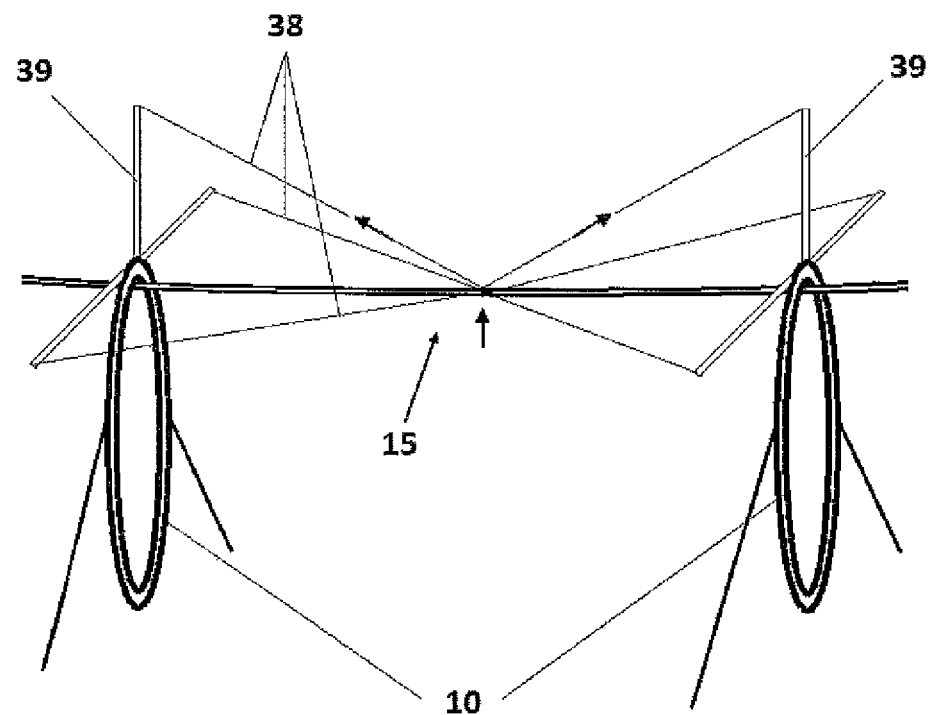
Figure 10:
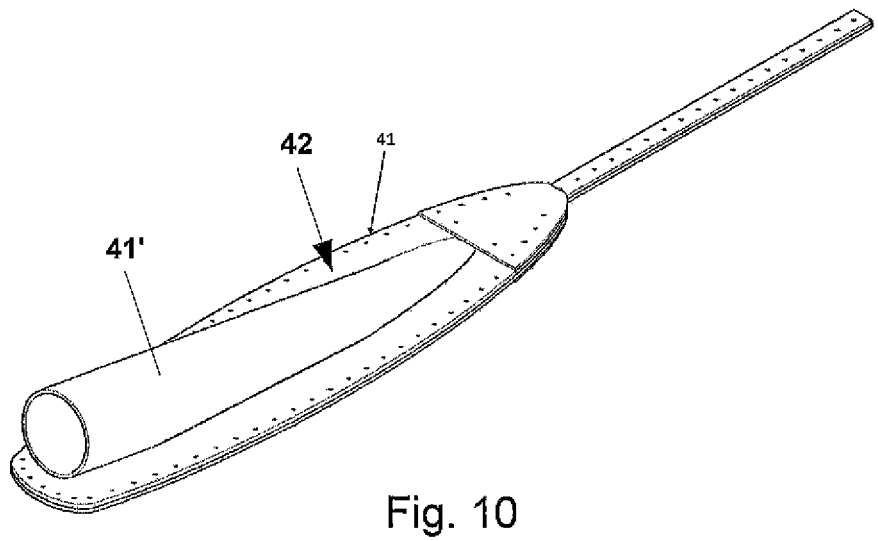
Figure 11:
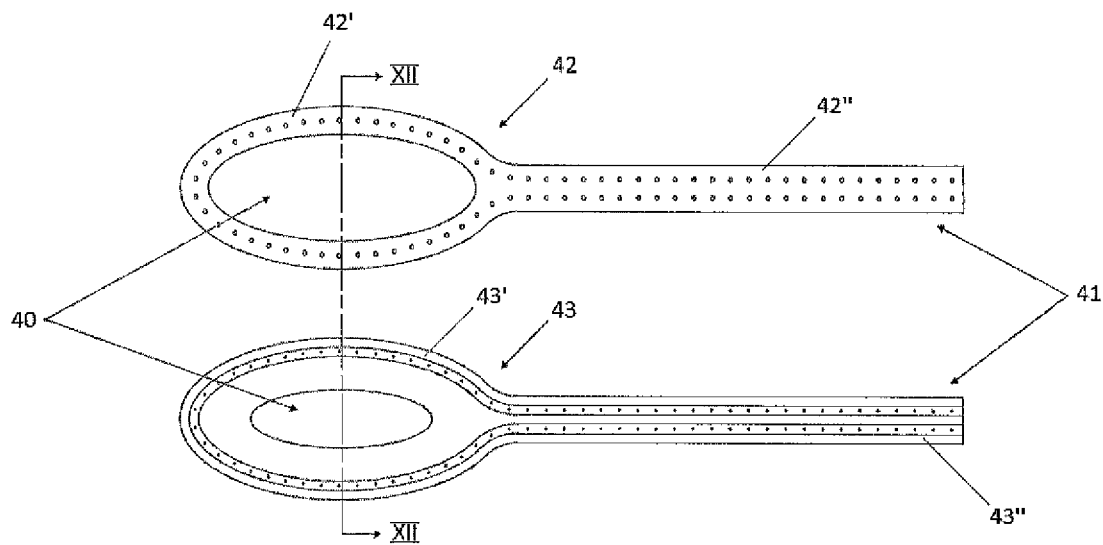
Figure 12:
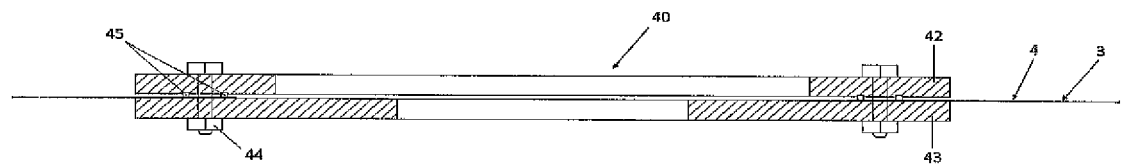
Figure 13:
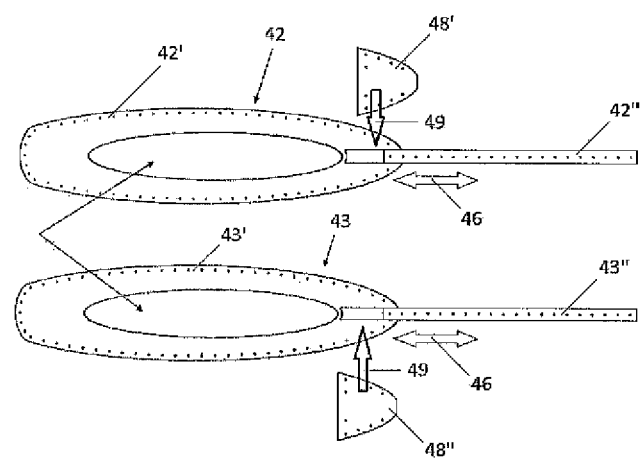
Figure 14:
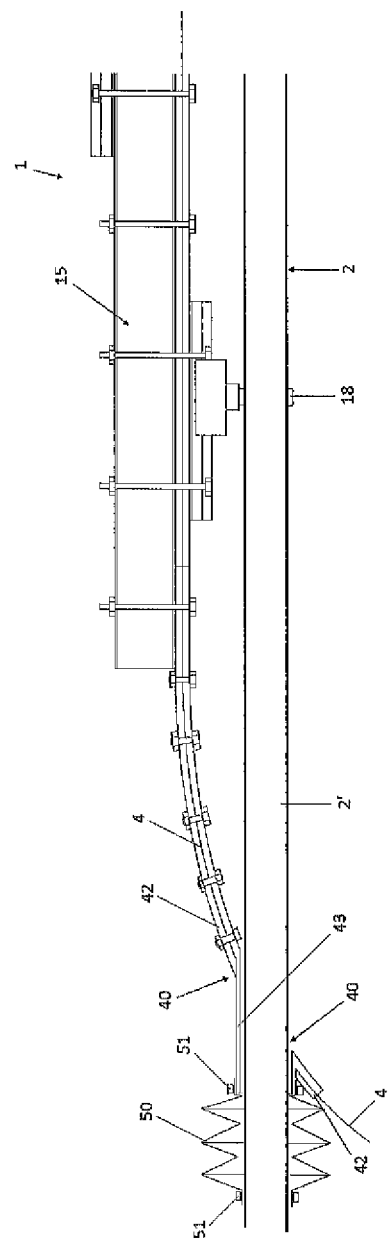
Figure 15:
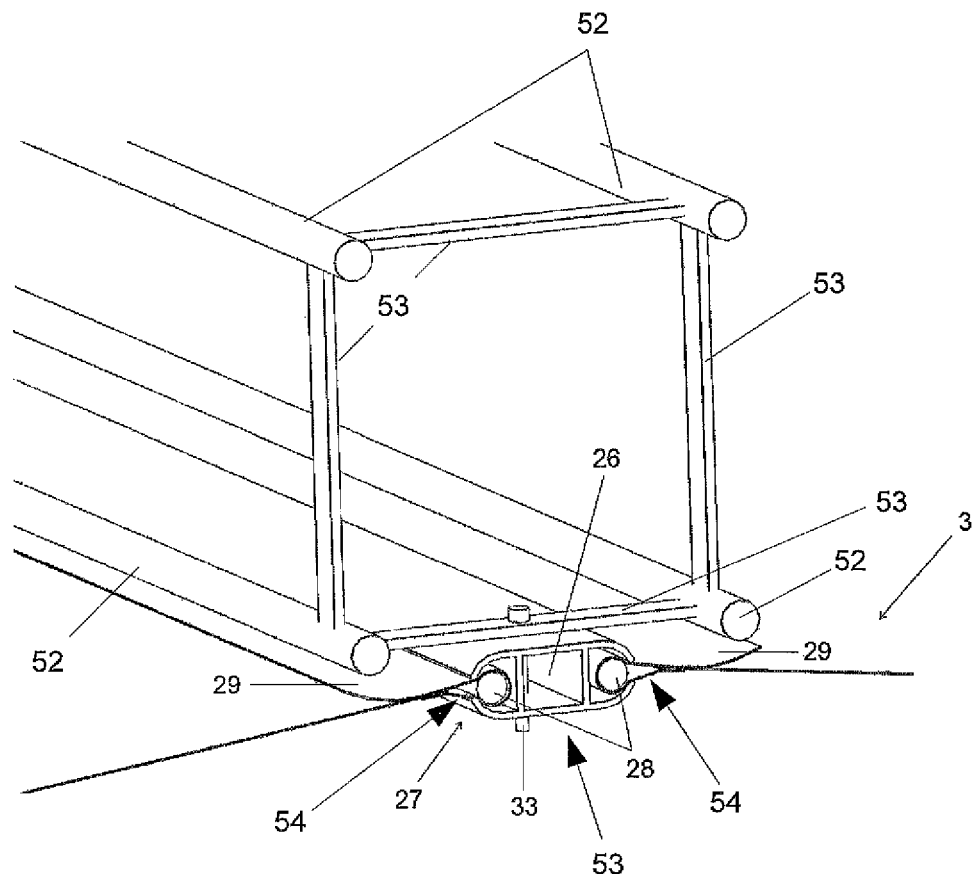

FIG. 9a and FIG. 9b respectively show schematic supporting and tensioning systems for supporting the absorber mount between adjacent tracking rings;

FIG. 10 schematically shows the absorber passing through an oval or ellipse-shaped through-opening in the area of an end face of the concentrator pad, wherein the through-opening is sealed by means of a sealing unit;

FIG. 11 shows a view of the sealing unit according to FIG. 10 which comprises a clamp part and a moulded part (shown next to each other);

FIG. 12 shows a cross-section of the sealing unit along line XII-XII in FIG. 11;

FIG. 13 shows a view corresponding to FIG. 11 of an alternative embodiment of the sealing unit with a tongue section movable in longitudinal direction;

FIG. 14 shows a longitudinal section of the concentrator device according to the invention at the face of the through-opening for the absorber; and FIG. 15 shows an illustrative view of a further embodiment of the concentrator device.

Figure 1:
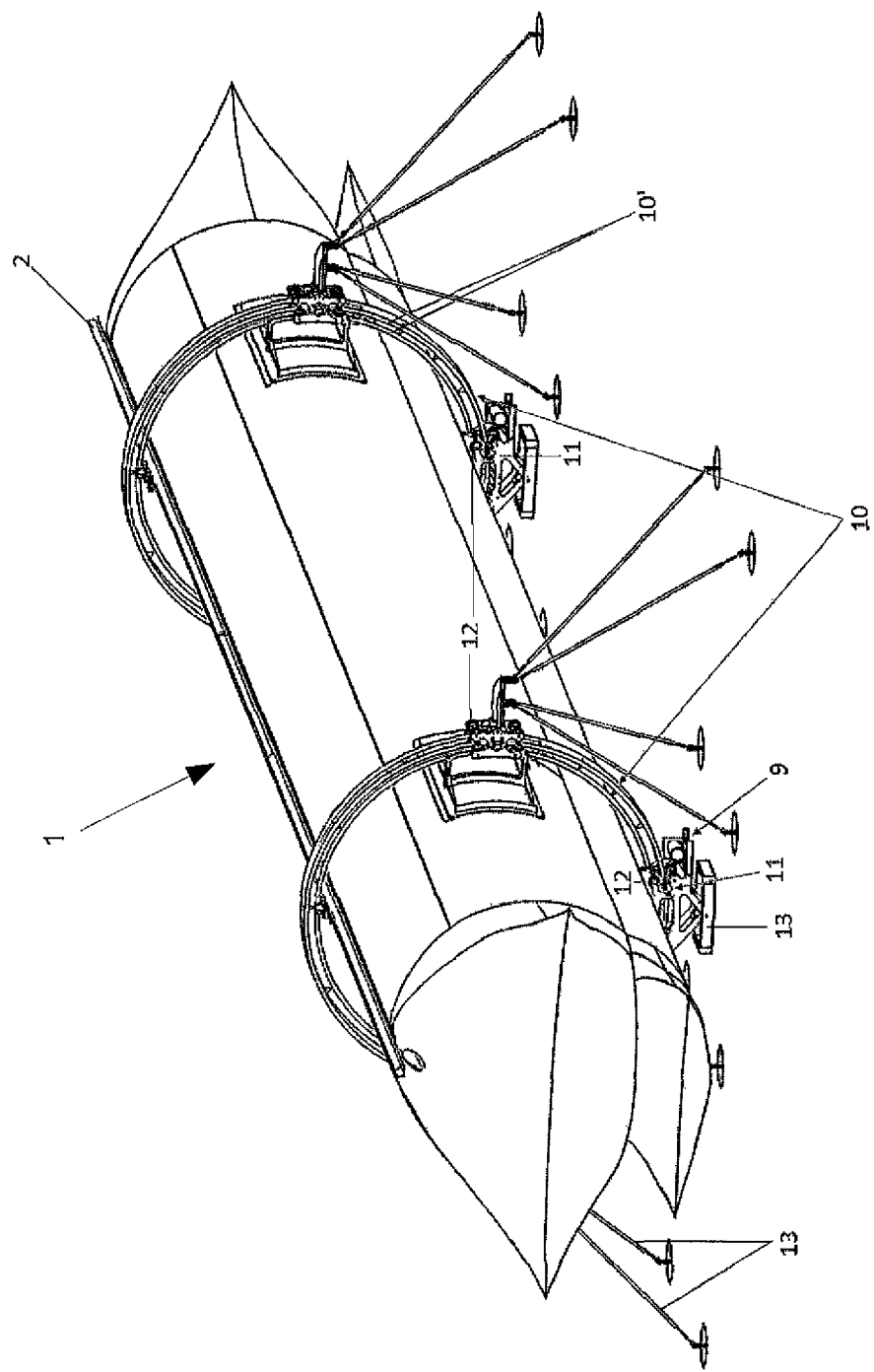
Figure 2:
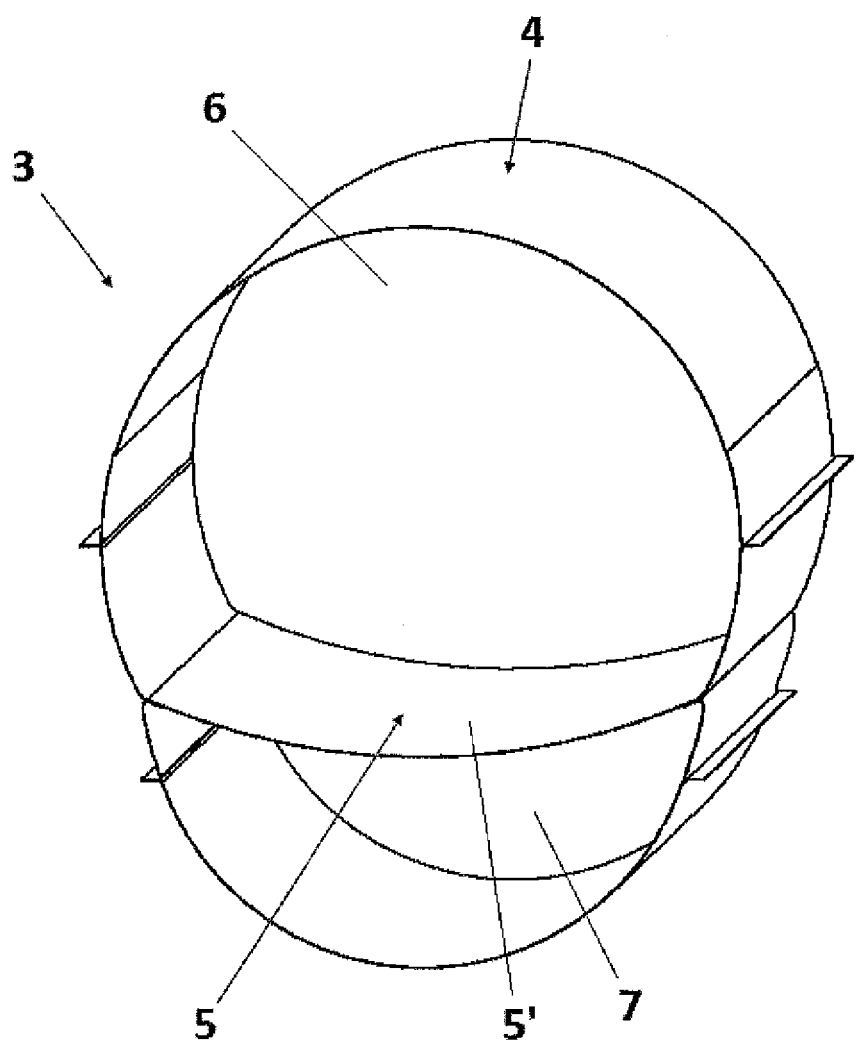
FIG. 2 shows a section of the anchoring frame of FIG. 1, which comprises a light-transmissive entry window and a reflector film subdividing the concentrator pad into at least two cavities.

FIG. 1 shows a device 1 for concentrating solar radiation in an absorber 2. The device 1 comprises an inflatable concentrator pad 3, constructed as shown in FIG. 2. Accordingly the concentrator pad 3 comprises an elongated, essentially cylindrical or hose-shaped casing, with a light-transmissive entry window 4 for coupling in the solar radiation. The casing is subdivided by a reflector film 5 into at least two separate cavities 6, 7, which are hermetically sealed. The reflector film 5 comprises a mirrored surface 5', which bundles the coupled-in solar radiation in direction of the absorber 2. The absorber 2 or the solar panel is situated in the focal range of the mirrored surface 5' within the upper cavity 6 adjoining the entry window 4, of the concentrator pad 3. The absorber 2 may be provided, in particular, in the form of a pipe 2' (see FIG. 14) carrying the medium or a photo voltaic element. The concentrator 1 can thus be utilised both for concentrated photo voltaics (CPV) and for thermal concentrated solar power (CSP). When the concentrator is in operation, a pressure gradient forms in the cavities 6, 7, whereby the reflector film 5 is evenly concavely arched so that the coupled-in solar radiation is focussed by the mirrored surface 5' in the absorber 2. The concentrator pad 3 with compressed air in the cavities 6, 7 is in principle self-supporting so that in comparison to conventional solar concentrators a considerably lower weight can be realised. As revealed in FIG. 2, the concentrator pad 3 is composed of individual thin-walled (plastic) films; a transparent film is provided for the entry window 4.

As shown in FIG. 1, anchoring of the concentrator pad 3 is effected by means of an anchoring frame 8 arranged outside the same for fixing the concentrator pad 3 in a predefined position. The anchoring frame 8 preferably comprises a tracking system 9 in order to cause the concentrator pad 3 to track the sun's path. To this end the tracking system 9 is designed to pivotably mount the concentrator pad 3 about at least one axis of the concentrator pad 3, here specifically about the longitudinal axis of the concentrator pad 3. The tracking system 9 of the anchoring frame 8 comprises several tracking rings 10 spaced apart in direction of the longitudinal axis 3' of the concentrator pad 3, which rings encircle the concentrator pad 3. Each tracking ring 10 consists of several individual rings 10' (three each in the embodiment shown), which are rotatably mounted by means of rolling devices 11. To this end the rolling device 11 comprises rollers 12 rolling on the rings 10'. Swivelling of the tracking rings 10 is effected by means of a drive (not shown). To this end the tracking ring 10 can be connected to a toothed belt, which is moved by a motor (not shown). Anchoring to the base is effected by various anchoring elements 13.

With known embodiments of such concentrator devices 1 the absorber 2 was directly suspended from the concentrator pad 3. However, suspension of the absorber 2 from the concentrator pad 3 has the disadvantage of leading to a deformation of the concentrator pad 3 at the attachment points; in addition the intrinsic weight of the absorber 2 causes sagging of the absorber 2 on the concentrator pad 3. This has the disadvantage that the absorber 2 when in operation is not accurately arranged in the focal range of the reflector film 5, resulting in a negative effect on energy conversion.

Figure 3:
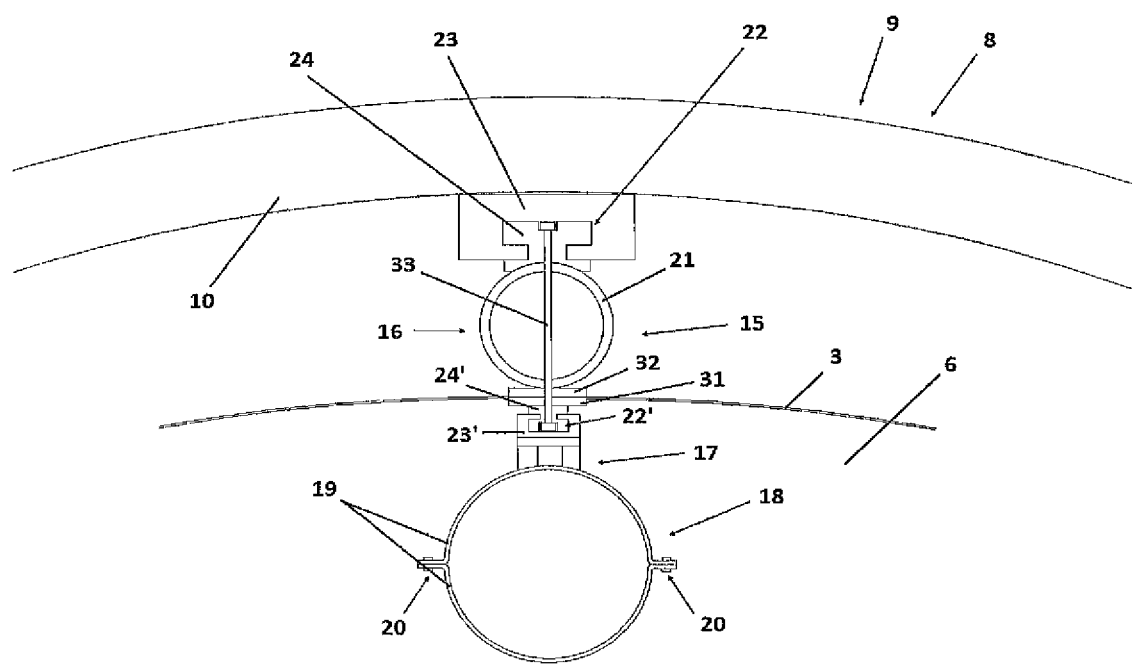
FIG. 3 shows a schematic detail view of the concentrator device of FIG. 1, wherein the absorber mount is connected with a tracking ring to cause the concentrator pad to track the path of the sun.

As shown in FIG. 3, this problem is solved on the concentrator device 1 by attaching the absorber 2 to the anchoring frame 8 by means of an absorber mount 15 so that the weight of the absorber 2 or the absorber mount 15 is born by the essentially rigid anchoring frame 8. In this way the concentrator pad 3 can be prevented from deforming, thereby reliably preventing insufficient focussing of the coupled-in solar radiation in the absorber 2. In consequence conversion of the solar energy is considerably more efficient. With the embodiment shown, connection of the absorber mount 15 to the anchoring frame 8 is effected via the tracking rings 10 of the tracking system 9, which to this effect comprises suitable connecting means (screwing, welding, bolt connections etc.).

As further shown in FIG. 3, the absorber mount 15 comprises a bearing unit 16 arranged outside the concentrator pad 3, which bearing unit is connected with the anchoring frame 8, here with a tracking ring 10. The absorber mount 15 further comprises an absorber holder 17 arranged in the cavity 6 inside the concentrator pad 3 and connected with the absorber 2. To this end the absorber holder 17 comprises at least one holding ring 18 which encircles the absorber 2 (not shown in FIG. 3). The holding ring 18 consists of two half shells 19, which are connected with each other via suitable fastening means 20 (screws, bolts, etc.).

As further shown in FIG. 3, the bearing unit 16 connected with the anchoring frame 8 comprises at least one pipe-shaped bearing element 21, which is characterised by high stiffness for low weight.

As shown in FIG. 3 a linear plain bearing 22 is formed between the tracking 9 and the absorber mount 15, resulting in the absorber 2 mount 15 being movably mounted on the anchoring frame 9 or the tracking ring 10. This will allow to compensate for temperature-dependent changes in length between the absorber mount 15 and the anchoring frame 8, here the tracking ring 10.

Figure 4:
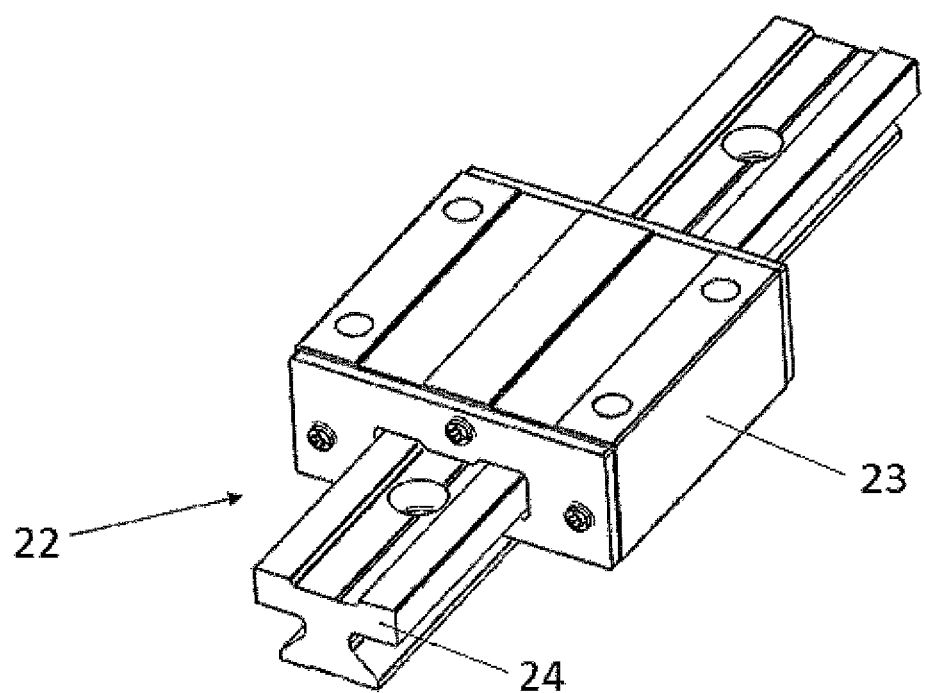
FIG. 4 shows an illustrative view of a linear plain bearing between the absorber mount and the tracking ring (see FIG. 3)

As shown in FIG. 3 and in more detail in FIG. 4, provision is made for a slide 23 attached to the anchoring frame 8 (the tracking ring 10 in the embodiment shown) which slide is movably mounted between the absorber mount 15 and the tracking system 9 in relation to a corresponding guide rail 24 fixed on the bearing unit 16 of the absorber mount 15. The guide rail 24 comprises a cross-section profile which essentially corresponds to a recess in the guiding slide 23.

Since the absorber holder 17 and the bearing unit 16, when the device 1 is in operation, may experience changes in length due to temperature fluctuations, a further linear plain bearing 22' is provided, by which the bearing unit 16 and the absorber holder 17 are movably mounted relative to each other. The linear plain bearing 22' may be configured so as to correspond to the linear plain bearing 22 between the bearing unit 16 and the tracking 9 (see FIG. 4). To this end the further linear plain bearing 22' comprises a guiding slide 23' fixed on the absorber holder 17, which is movably mounted relative to a guide rail 24'.

Figure 5:
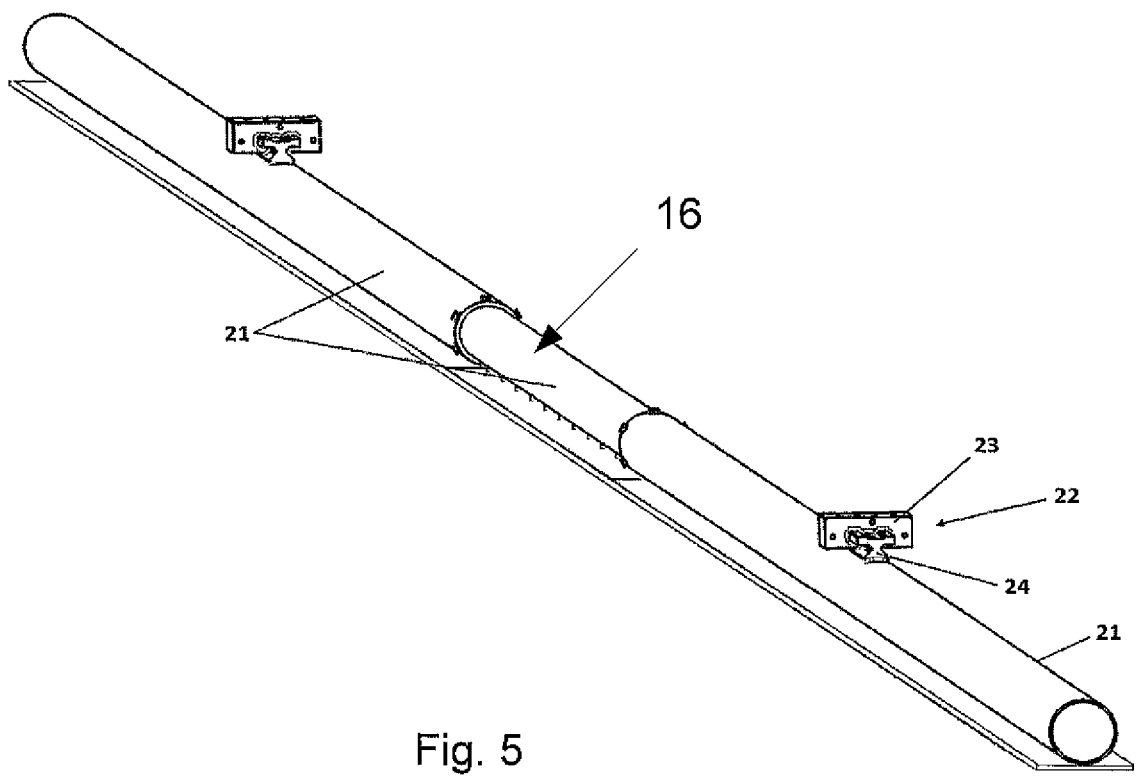
FIG. 5 shows an illustrative view of a bearing unit of the absorber mount according to FIG. 3, which can be arranged outside the concentrator pad and which is constructed of several pipe-shaped bearing elements the ends if which are plugged into each other.

FIG. 5 shows a detail view of the bearing unit 16 of the absorber mount 15 with the linear plain bearing 22, consisting of the slide 23 and the guide rail 24. Further the bearing unit 16 comprises several pipe-shaped bearing elements 21 the end sections of which have been plugged into each other. To this end adjacent bearing elements 21 comprise different diameters so that the bearing elements 21 fit into each other.

Figure 6:
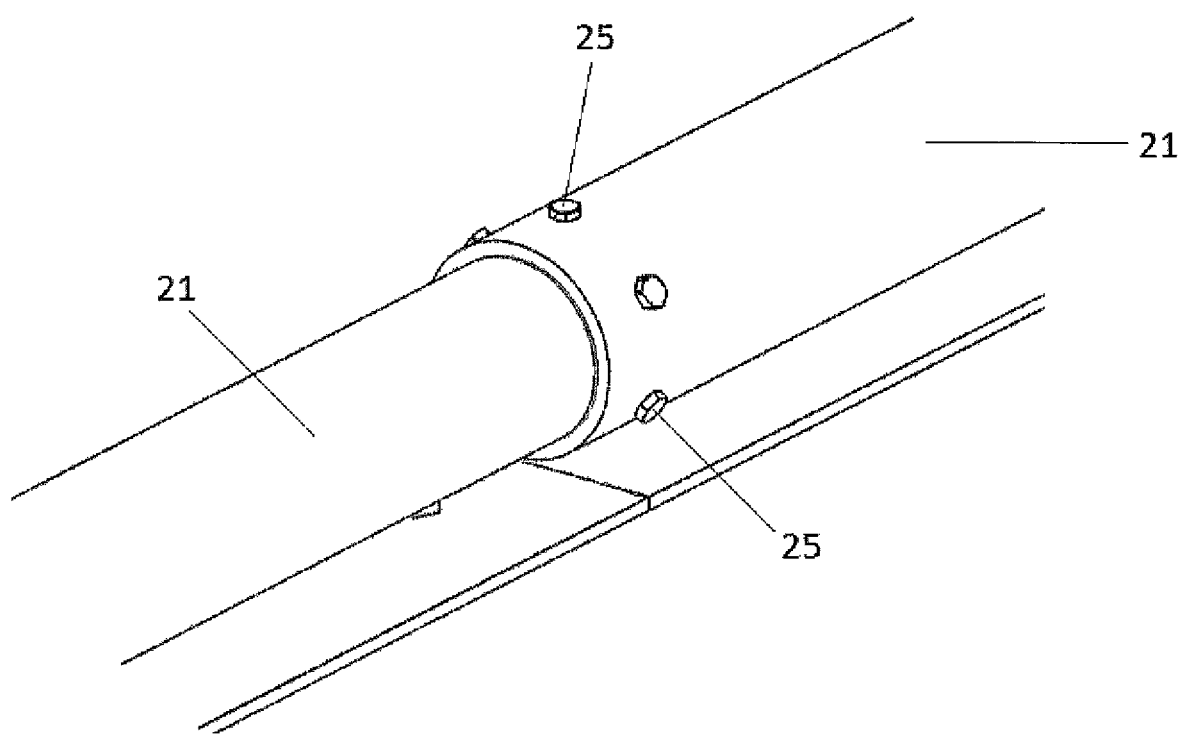
FIG. 6 shows a detail view of the bearing unit shown in FIG. 5 in the connection area of two adjacent pipe-shaped bearing elements, wherein the modular construction of the bearing unit is revealed.

As shown in FIG. 6, the pipe-shaped bearing elements are detachably connected with each other thereby facilitating a modular construction of the bearing unit 16. Depending upon the length of the concentrator pad 3 a corresponding number of pipe-shaped bearing elements 21 can be connected with each other. The detachable connection of the pipe-shaped bearing elements 21 may be effected by screw connections 25.

Figure 7:
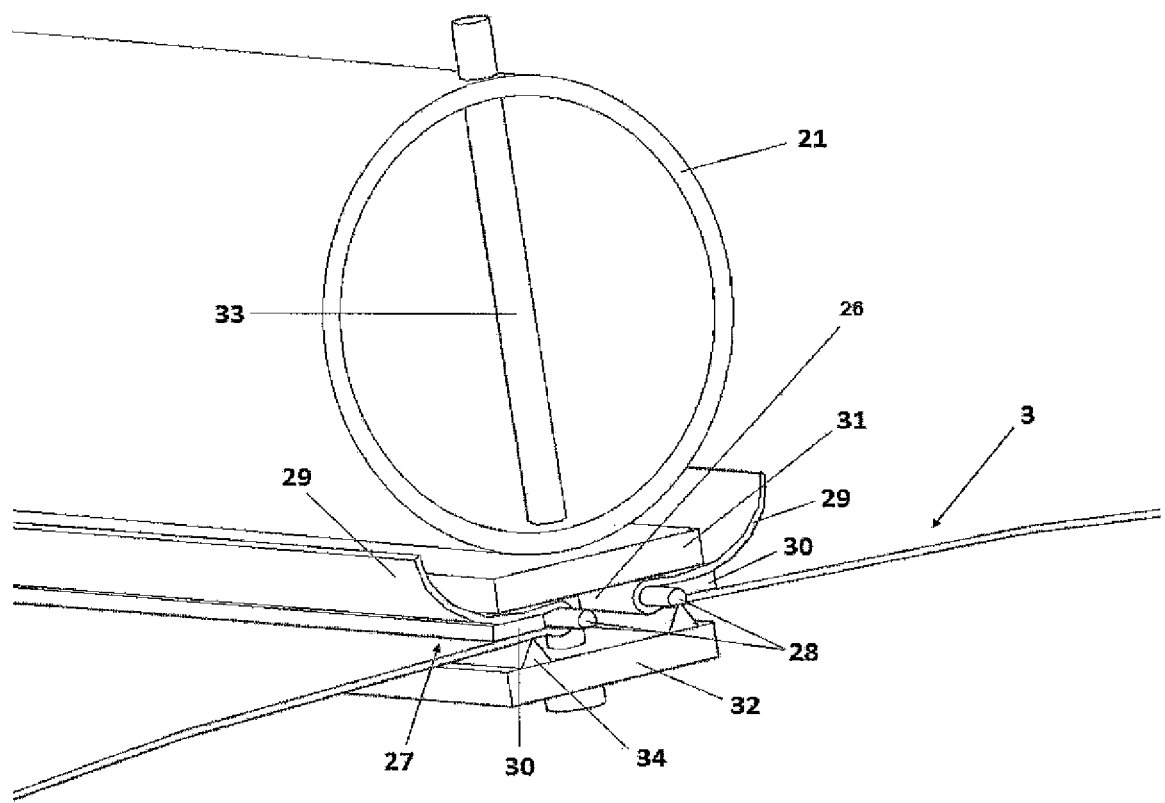
FIG. 7 shows an illustrative view of the concentrator device according to the invention in the area of attachment opening of the concentrator pad sealed on all sides for connecting the absorber mount.

As revealed in FIG. 7 the concentrator pad 3 comprises an attachment opening 26 for connecting the absorber 2 to the anchoring frame 8, which opening, in the embodiment shown, is situated in the area of the entry window 4 of the concentrator pad 3. The bearing unit 16 and the absorber holder 17 are connected with each other via the attachment opening 26. In order to prevent air from escaping from the cavity 6 of the concentrator pad 3, the attachment opening 26 is sealed on all sides. To this end a keder system 27 is provided in the embodiment of FIG. 7. The keder system 27 comprises keders 28 arranged adjacent to the attachment opening 26. The edges of the transparent membrane of the concentrator pad 3 are folded over the keders 28 thus forming keder battens 29. The keder battens 29 are fixed between the folded-over sections of the transparent membrane by means of an adhesive strip 30 preferably made of a foam material. Furthermore the keder battens 29 make it easy to grip and handle the transparent film during the assembly operation, in particular when positioning the keder between the clamping plates 31, 32.

As further revealed in FIG. 7 the keder battens 29 are clamped between clamping plates 31 (see also FIG. 3) of the absorber mount 15. The clamping plates 31, 32 are connected to the bearing unit 16 or to the absorber holder 17. A suitable clamping force between the clamping plates 31, 32 is ensured by providing a clamping element in form of a screw 33 extending through the pipe-shaped bearing element 21 and the clamping plates 31, 32, and this is tightened by a corresponding clamping force. In order to prevent the keder system 27 from slipping between the clamping plates 31, 32, provision is additionally made for adhesive strips on both sides of the attachment opening 26, which adhesive strips may, for example, be arranged on the inside of the lower clamping plate 31 connected with the absorber holder 17.

Figure 8:
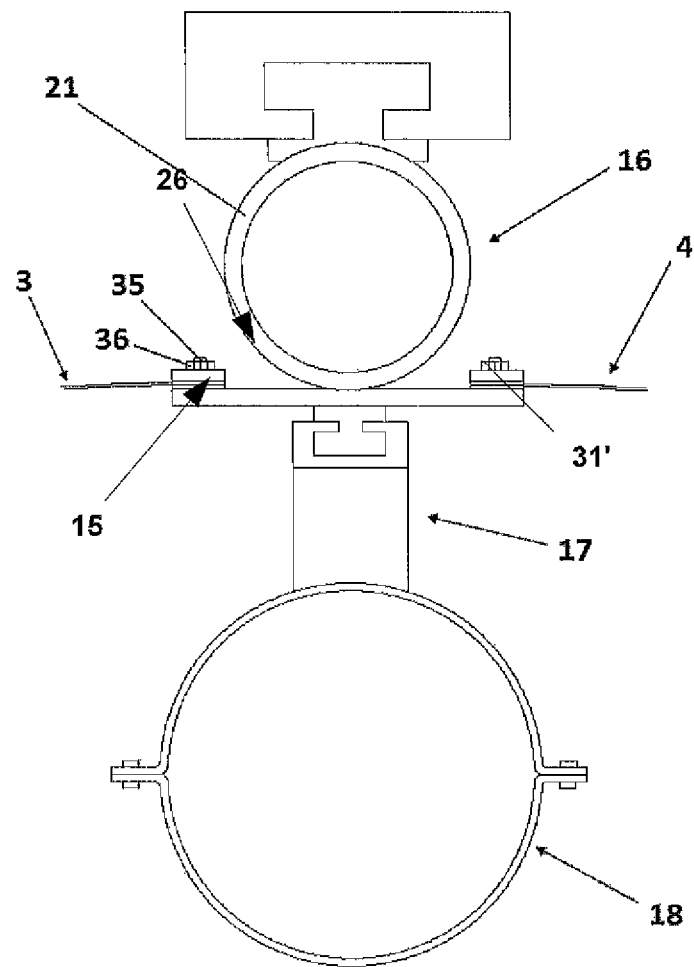
FIG. 8 shows a view of an alternative embodiment for tightly closing the attachment opening of the concentrator pad.

In FIG. 8 an alternative embodiment for tightly sealing the attachment opening 26 in the transparent entry window 4 of the concentrator pad 3 is shown. As revealed in FIG. 8, holes are provided on the edges of the transparent film of the entry window 4, for hooking in attachment means 35 (e.g. screws or bolts) connected with a plate 31' of the absorber mount 15. The holed sections of the entry window 4 are sealed using intermediate seals and clamped tight by means of screw nuts 36.

The connection of the absorber 2 to the anchoring frame 8 is preferably effected on each of the tracking rings 10 spaced apart in longitudinal direction of the concentrator pad 3, wherein an attachment opening 26 sealed on all sides in the concentrator pad 3 (see in particular FIG. 7 or FIG. 8) is respectively provided, in order to connect the absorber holder 17 arranged inside the concentrator pad 3 to the bearing unit 16 arranged outside the concentrator pad 3.

As revealed in FIGS. 9a and 9b, a supporting or tensioning system 37 may be additionally provided in order to reduce deformation or sagging caused by the intrinsic weight of the absorber mount 15 between adjacent tracking rings 10. To this end the supporting or tensioning system 37 comprises several rope-type tensioning elements 38 the free ends of which are attached to the absorber mount 15 or a supporting element 39 of the anchoring frame 8.

According to FIG. 9a essentially vertically arranged supporting elements 39 are provided which are attached to the tracking system 10. The free ends of the rope-type tensioning elements 38 are connected with the free ends of the supporting elements 39 or the absorber mount 15 (preferably in a central area between adjacent tracking rings 10).

According to the embodiment shown in FIG. 9b, essentially horizontally arranged supporting elements 39 are attached to the tracking rings 10, which support the absorber mount 15 transversely to the longitudinal direction of the absorber 2.

In order to enable peripheral units such as evaporators, steam turbines etc. to be coupled to the absorber 2, the absorber protrudes from the cavity of the concentrator pad 3 in the area of the end faces thereof. Previously essentially circular-shaped openings in the concentrator pad 3 have been used for this purpose, which openings were sealed by means of a plastic flap, but this did not lead to a satisfactory sealing of the concentrator pad 3.

As revealed in FIGS. 10 to 14, the concentrator pad 3 in the shown embodiment comprises an oval- or ellipse-shaped through-opening 40 in the area of at least one end face for the absorber pipe 2' to pass through (see FIG. 14). In order to prevent air from escaping in the area of the through-opening 40, a sealing unit 41 is provided. As revealed in FIG. 10, the sealing unit 41 comprises a through-pipe 41' manufactured in particular from a plastic material, through which the absorber pipe 2' (not shown in FIG. 10) is passed from the cavity 6 of the concentrator pad 3 to the outside.

As shown in FIG. 11, the sealing unit 41 comprises an external clamp part 42 and an internal moulded part 43, which is connected with the through-pipe 41' (see FIG. 14) not shown in FIG. 11. The clamp part 42 and the moulded part 43 each comprise an oval section 42' or 43' including the through-opening 40, which changes to become an elongated tongue section 42" or 43". The through-opening 40 in the moulded part 43 is made smaller (see FIG. 12) corresponding to its arrangement below the clamp part 42.

As revealed in FIG. 12, the transparent film of the entry window 4 is clamped in the edge area between the moulded part 43 and the clamp part 42, in order to seal the through-opening 40 by means of the sealing unit 41. In order to improve the sealing effect, provision is made for sealing elements 45 on both sides of a screw connection 44 protruding through both the moulded part 43 and the clamp part 42.

As schematically shown in FIG. 13, the oval section 42' or 43' and the tongue section 42" or 43" of the clamp part 42 or the moulded part 43 may be formed by individual elements (manufactured in particular from plastic material, e.g. polycarbonate), which are movable relative to each other in a provisional assembly position in longitudinal direction (see arrow 46). This has the advantage that manufacturing tolerances in the area of the through-opening 40 can be compensated for. After the oval sections 42' or 43' and the tongue sections 42", 43" have been placed into the desired position, the clamp part 42 or the moulded part 43 are fixed in their final assembly position by means of a connecting piece 48' or 48" (see arrow 49).

FIG. 14 shows a longitudinal section through the concentrator pad 3 in the area of the absorber exit. Due to the high temperatures in the absorber pipe 2' considerable changes in length may occur in operation, which endanger the air-tight closure of the concentrator pad 3. In order to make the exit of the absorber 2 through the through-opening 40 as air-tight as possible, a bellows 50 is provided outside the concentrator pad 3, which may be, for example, attached by means of metal clamps 51 to the sealing unit 41 (here on the through-pipe 41' connected with the moulded part 43) or to the absorber 2 (here on the absorber pipe 2'). In operation the bellows 50 adapts itself to the changes in length of the absorber 2, thereby reliably preventing air from escaping.

FIG. 15 shows a further embodiment of the device 1, which is different from the previously discussed embodiments with regard to the construction of the absorber mount 15 and the sealing of the attachment opening 26. According to FIG. 15 the bearing unit 16 of the absorber mount 15 comprises several longitudinal beams 52—four in the embodiment shown—extending in longitudinal direction of the concentrator pad 3, which are connected with each other in a kind of framework via transverse beams 53. The keder system 27 according to FIG. 15 comprises a profile element 53, which extends along the attachment opening 26. The keders 28 are received within the profile element 53, which comprises lateral openings 54 to allow the keder battens 29 to pass through. When inflating the concentrator pad 3 the keders 28 are pressed against the lateral inner surfaces of the profile element 53, thereby sealing the attachment opening 26 towards the outside.

The invention claimed is:

1. A device for concentrating solar radiation in an absorber, the device comprising:
   the absorber,
   an inflatable concentrator pad having a light-transmissive entry window for coupling in the solar radiation, having a reflector film subdividing the inflatable concentrator pad into at least two cavities, and having an attachment opening in the light-transmissive entry window, the absorber being arranged in a first cavity of the at least two cavities, and the reflector film being designed to concentrate the solar radiation in the absorber;
   an anchoring frame arranged outside the inflatable concentrator pad for anchoring the inflatable concentrator pad; and
   an absorber mount attaching the absorber to the anchoring frame and comprising a bearing unit and an absorber holder, the bearing unit being arranged outside the inflatable concentrator pad and the absorber holder being arranged inside the inflatable concentrator pad;
   wherein the absorber is suspended via the absorber mount on the anchoring frame;
   wherein the bearing unit and the absorber holder are connected with each other via the attachment opening; and
   wherein the attachment opening is sealed on all sides.

2. The device according to claim 1, wherein the absorber mount is connected to a tracking system of the anchoring frame the tracking system being designed to pivotably mount the inflatable concentrator pad about at least one axis.

3. The device according to claim 2, wherein the absorber mount is connected with at least one, preferably several tracking rings spaced apart in longitudinal direction of the concentrator pad, the at least one tracking ring encircling the concentrator pad.

4. The device according to claim 1, wherein the absorber mount is movably mounted on a tracking ring of the anchoring frame in a longitudinal direction of the absorber.

5. The device according to claim 4, wherein a linear plain bearing is formed between the tracking system and the absorber mount, the linear plain bearing comprising a slide fixed on the anchoring frame or on the absorber mount and a corresponding guide rail fixed on the absorber mount or the tracking system.

6. The device according to claim 1, wherein the bearing unit of the absorber mount comprises several pipe-shaped bearing elements plugged into each other in their end areas.

7. The device according to claim 1, wherein the bearing unit and the absorber holder are mounted so as to be movable relative to each other in a longitudinal direction of the absorber via a linear guide comprising a linear plain bearing.

8. The device according to claim 1, wherein a keder system is provided for sealing the attachment opening of the inflatable concentrator pad.

9. The device according to claim 8, wherein a clamping element comprising a screw and acting between clamping plates of the absorber mount is provided for applying a clamping force between the clamping plates.

10. The device according to claim 1, wherein a supporting or tensioning system is arranged between the anchoring frame and the absorber mount in an area outside the connections with the anchoring frame.

11. The device according to claim 10, wherein the supporting or tensioning system comprises at least one rope-like tensioning element, the ends of the rope-like tensioning element being attached to the absorber mount or to a supporting element connected with a tracking ring of the anchoring frame.

12. An anchoring frame configured to anchor an inflatable concentrator pad for concentrating solar radiation in an absorber arranged in the inflatable concentrator pad, the anchoring frame comprising:
- a tracking ring configured to surround the concentrator pad; and
- an absorber mount configured to connect with the absorber, to suspend the absorber, and to support the absorber by protruding through at least one attachment opening of the inflatable concentrator pad, the absorber mount comprising a bearing unit and an absorber holder, the absorber mount being attached to the tracking ring at a top of the tracking ring, the top of the tracking ring being disposed opposite from the bottom of the tracking ring, the absorber mount protruding from the top of the tracking ring towards the bottom of the tracking ring.

13. An inflatable concentrator pad for concentrating solar radiation in an absorber arrangeable therein, the inflatable concentrator pad comprising:
- a light-transmissive entry window for coupling in the solar radiation, the light-transmissive entry window comprising at least one attachment opening for allowing an absorber mount connectable with the absorber to pass through the light-transmissive entry window; and
- a reflector film subdividing the inflatable concentrator pad into at least two cavities and designed to concentrate the solar radiation in the absorber.

14. The inflatable concentrator pad according to claim 13, wherein the inflatable concentrator pad, in the area of at least one end face, comprises an oval or ellipse shaped through-opening for the absorber to pass through.

* * * * *

UNITED STATES PATENT AND TRADEMARK OFFICE
CERTIFICATE OF CORRECTION

PATENT NO. : 9,033,528 B2
APPLICATION NO. : 14/114295
DATED : May 19, 2015
INVENTOR(S) : Stoeger et al.

It is certified that error appears in the above-identified patent and that said Letters Patent is hereby corrected as shown below:

In the Claims

In particular, in Column 10, line 28 (Line 3 in Claim 2), after "frame" please insert: -- , --.

Signed and Sealed this
Eighth Day of September, 2015

Michelle K. Lee
*Director of the United States Patent and Trademark Office*